(12) United States Patent
Seo et al.

(10) Patent No.: US 7,420,831 B2
(45) Date of Patent: Sep. 2, 2008

(54) SEMICONDUCTOR CHIP AND SEMICONDUCTOR CHIP PACKAGE COMPRISING SEMICONDUCTOR CHIP

(75) Inventors: Eun-sung Seo, Seoul (KR); Mi-jo Kim, Suwon-si (KR); Soo-young Kim, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 2 days.

(21) Appl. No.: 11/702,092

(22) Filed: Feb. 5, 2007

(65) Prior Publication Data

US 2007/0189050 A1   Aug. 16, 2007

(30) Foreign Application Priority Data

Feb. 10, 2006   (KR) ...................... 10-2006-0013123

(51) Int. Cl.
*G11C 5/06* (2006.01)
(52) U.S. Cl. ...................... 365/63; 365/189.09; 365/226
(58) Field of Classification Search ................... 365/63, 365/189.09, 226
See application file for complete search history.

(56) References Cited

U.S. PATENT DOCUMENTS 6,115,801 A *  9/2000  Rolandi ................. 365/233.11
6,366,487 B1    4/2002  Yeom
2003/0122254 A1  7/2003  Lyne
2005/0152210 A1* 7/2005  Park et al. .................... 365/233

FOREIGN PATENT DOCUMENTS

| JP | 2004-150813 | 5/2004 |
|---|---|---|
| KR | 1020000045691 A | 7/2000 |
| KR | 1020010097153 A | 11/2001 |
| KR | 1020050067784 A | 7/2005 |

* cited by examiner

*Primary Examiner*—Huan Hoang
(74) *Attorney, Agent, or Firm*—Volentine & Whitt, PLLC

(57) ABSTRACT

Embodiments of the invention provide a semiconductor chip and a semiconductor chip package comprising a semiconductor chip. In one embodiment, the invention provides a semiconductor chip comprising a memory cell array, a control circuit, and a chip selection signal generating circuit electrically connected to first and second option pads. In the semiconductor chip, the chip selection signal generating circuit is enabled in accordance with a dual chip enable signal, and the control circuit is enabled and disabled in accordance with the chip selection signal received from the chip selection signal generating circuit. In addition, the chip selection signal generating circuit is adapted to generate a chip selection signal in accordance with signals received through the first and second option pads, respectively.

24 Claims, 6 Drawing Sheets

SEMICONDUCTOR CHIP AND SEMICONDUCTOR CHIP PACKAGE COMPRISING SEMICONDUCTOR CHIP

BACKGROUND

1. Field of the Invention

Embodiments of the invention relate to a semiconductor chip and a semiconductor chip package comprising a semiconductor chip. In particular, embodiments of the invention relate to a semiconductor chip that requires the use of fewer option pads to operate in a dual chip mode, and a semiconductor chip package comprising the semiconductor chip.

This application claims priority to Korean Patent Application No. 10-2006-0013123, filed on Feb. 10, 2006, the subject matter of which is hereby incorporated by reference in its entirety.

2. Description of Related Art

In order to achieve a relatively high degree of integration and relatively large storage capacity in a semiconductor device, a technique for mounting a plurality of individual semiconductor chips in one package has been developed. Such a technique, in which two identical semiconductor chips are mounted in one package, is disclosed, for example, in U.S. Pat. No. 6,366,487.

A dual chip package, in which two semiconductor chips are mounted, has the same package pins as a conventional chip package, such as an address pin, a control pin, and a data pin. The two semiconductor chips may be referred to individually as a first semiconductor chip and a second semiconductor chip, and each of the first and second semiconductor chips comprises a first, a second, and a third option pad. The first and second semiconductor chips disposed in the dual chip package can be used individually through the use of the three option pads of each semiconductor chip. Specifically, a dual chip enable signal is provided to each of the semiconductor chips through its first option pad, and each of the two semiconductor chips then enters a dual chip mode (i.e., a dual chip option). Further, each of the first and second semiconductor chips receives a most significant bit (MSB) address signal through its second option pad and a voltage signal from outside of the semiconductor device through its third option pad. The first or second semiconductor chip (i.e., an upper or lower semiconductor chip) is selected in accordance with the MSB address signal and the voltage signals received by the first and second semiconductor chips, respectively. For example, when the logic level of the MSB address signal is low and the logic level of the voltage signal received by the first semiconductor chip is high, the first semiconductor chip is selected, and when the logic level of the MSB address signal is high and the logic level of the voltage signal received by the second semiconductor chip is low, the second semiconductor chip is selected.

A pseudo static random access memory (PSRAM) device has properties in common with both a DRAM and an SRAM. Specifically, the PSRAM uses the internal cell structure of a dynamic random access memory (DRAM) device, and the PSRAM is externally similar to a static random access memory (SRAM) device. A cell of a PSRAM device comprises one transistor and one capacitor, like a cell of a DRAM device, so PSRAM is referred to as unit transistor random access memory (UTRAM).

Because of the high degree of integration and the large storage capacity of the dual chip package, the number of channels available for use in testing the device is restricted. Specifically, the number of test channels for a PSRAM device disposed in the dual chip package is insufficient (compared with a DRAM device disposed in the dual chip package) because a low address signal and a column address signal are supplied through separate pads of a PSRAM device.

SUMMARY

Embodiments of the invention provide a semiconductor chip and a semiconductor package comprising the semiconductor chip in which fewer option pads of the semiconductor chip are used for the dual chip mode in order to improve the testing environment of the semiconductor chip.

In one embodiment, the invention provides a semiconductor chip comprising a memory cell array adapted to store data, a control circuit adapted to control an operation mode of the memory cell array in accordance with a plurality of signals received from outside of the semiconductor chip, and a chip selection signal generating circuit electrically connected to first and second option pads. In the semiconductor chip, the chip selection signal generating circuit is enabled in accordance with a dual chip enable signal, the dual chip enable signal is set to a default logic level when the semiconductor chip is in a power up mode, and the control circuit is enabled and disabled in accordance with the chip selection signal received from the chip selection signal generating circuit. In addition, the chip selection signal generating circuit is adapted to generate a chip selection signal in accordance with a first voltage signal received through the first option pad and a second voltage signal received through the second option pad, or in accordance with a chip selection address signal received through the first option pad and a third voltage signal received through the second option pad. Also, the chip selection signal generating circuit is adapted to generate a chip selection signal having a first logic level when the first voltage signal is received through the first option pad and the second voltage signal is received through the second option pad, and the control circuit is enabled when the control circuit receives the chip selection signal having the first logic level.

In another embodiment, the invention provides a semiconductor chip package comprising first and second semiconductor chips each having the same address coding scheme and each comprising first and second option pads. Each of the first and second semiconductor chips comprises a memory cell array adapted to store data, a control circuit adapted to control an operation mode of the memory cell array in accordance with a plurality of signals received from outside of the semiconductor chip, and a chip selection signal generating circuit adapted to generate a chip selection signal in accordance with a chip selection address signal received from outside of the semiconductor chip and through the first option pad, and a voltage signal received through the second option pad. Also in each of the semiconductor chips, the chip selection signal generating circuit is enabled in accordance with a dual chip enable signal generated inside of the semiconductor chip, the chip selection signal generating circuit is adapted to provide the chip selection signal to the control circuit, and the control circuit is enabled and disabled in accordance with the chip selection signal.

In yet another embodiment, the invention provides a semiconductor chip package comprising a semiconductor chip adapted to operate in a dual chip mode. The semiconductor chip comprises first and second option pads, a memory chip array adapted to store data, a control circuit adapted to control an operation mode of the memory cell array in accordance with a plurality of signals received from outside of the semiconductor chip, and a chip selection signal generating circuit electrically connected to the first and second option pads. In the semiconductor chip the chip selection signal generating circuit is adapted to generate a chip selection signal having a first logic level in accordance with first and second voltage signals received through the first and second option pads, respectively, and is adapted to provide the chip selection signal to the control circuit. Also in the semiconductor chip, the control circuit is enabled by the chip selection signal having the first logic level, the chip selection signal generating circuit is enabled in accordance with a dual chip enable signal, and the dual chip enable signal is set to a default logic level when the semiconductor chip is in a power up mode.

BRIEF DESCRIPTION OF THE DRAWINGS

Embodiments of the invention will be described herein with reference to the accompanying drawings, in which like reference symbols indicate like elements throughout. In the drawings.

DESCRIPTION OF EMBODIMENTS

Figure 1:
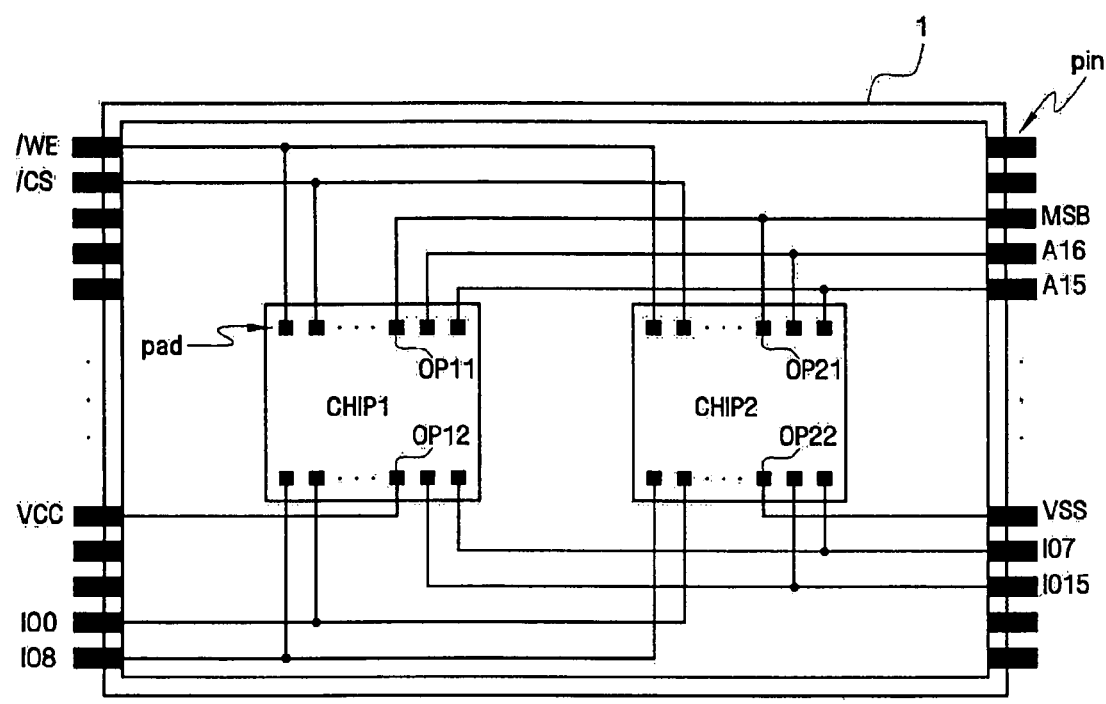
FIG. 1 is a layout diagram illustrating a semiconductor chip package in accordance with an embodiment of the invention.

FIG. 1 is a layout diagram illustrating a semiconductor chip in accordance with an embodiment of the invention.

Referring to FIG. 1, a semiconductor chip package 1, in accordance with an embodiment of the invention, is a dual chip package and comprises a first semiconductor chip CHIP1 and a second semiconductor chip CHIP2.

First and second semiconductor chips CHIP1 and CHIP2 may be substantially the same. Specifically, first and second semiconductor chips CHIP1 and CHIP2 may have the same pad layout, storage capacity, and address coding scheme. Therefore, first and second semiconductor chips CHIP1 and CHIP2 may be created from the same wafer.

Further, package pins of semiconductor chip package 1 such as an address pin, a control pin, and a data pin may be connected to both first semiconductor chip CHIP1 and second semiconductor chip CHIP2. Therefore, when seen from outside of semiconductor chip package 1, first and second semiconductor chips CHIP1 and CHIP2 appear to operate as one integrated semiconductor device, and not as two semiconductor chips.

In the embodiment illustrated in FIG. 1, a chip selection address signal and a first voltage signal are provided to first semiconductor chip CHIP1 from outside of semiconductor chip package 1 and the chip selection address signal and a second voltage signal are provided to second semiconductor chip CHIP2 from outside of semiconductor chip package 1. First and second semiconductor chips CHIP1 and CHIP2 each receive the same chip selection address signal. First semiconductor chip CHIP1 comprises a first option pad OP11 and a second option pad OP12, and second semiconductor chip CHIP2 comprises a first option pad OP21 and a second option pad OP22. First semiconductor chip CHIP1 receives the chip selection address signal and the first voltage signal through first and second option pads OP11 and OP12, respectively. Second semiconductor chip CHIP2 receives the chip selection address signal and the second voltage signal through first and second option pads OP21 and OP22, respectively. One of first and second semiconductor chips CHIP1 and CHIP2 is selected in accordance with the selection address signal and the first and second voltage signals.

In particular, in the embodiment illustrated in FIG. 1, first option pads OP11 and OP21 of first and second semiconductor chips CHIP1 and CHIP2, respectively, are bonded to a package pin that receives the chip selection address signal, for example, a Most Significant Bit (MSB) address signal. Second option pad OP12 of first semiconductor chip CHIP1 is bonded to a package pin that receives a power voltage VCC, and second option pad OP22 of second semiconductor chip CHIP2 is bonded to a package pin that receives a ground voltage VSS. Therefore, since second option pads OP12 and OP22 are used to distinguish between first and second semiconductor chips CHIP1 and CHIP2, second option pads OP12 and OP22 are preferably bonded to package pins that receive voltages having different levels.

In the embodiment of semiconductor chip package 1 illustrated in FIG. 1, first semiconductor chip CHIP1 enters a dual chip mode (i.e., a dual chip option) in response to a dual chip enable signal generated inside of first semiconductor chip CHIP1, and second semiconductor chip CHIP2 enters a dual chip mode in response to a dual chip enable signal generated inside of second semiconductor chip CHIP2. Thus, each semiconductor chip enters the dual chip mode without using a separate dual chip enable signal received from outside of the semiconductor chip itself. For example, for each of the first and second semiconductor chips CHIP1 and CHIP2, the semiconductor chip enters the dual chip mode when the dual chip enable signal of the semiconductor chip has a default logic level, which occurs when the semiconductor chip is in a power up mode. That is, for each of the first and second semiconductor chips CHIP1 and CHIP2, when the semiconductor chip is in a power up mode, the dual chip enable signal is set to a default logic level, and, in response, the semiconductor chip enters the dual chip mode. As used herein, when a semiconductor chip is in "dual chip mode", the semiconductor chip is either operated or not in accordance with whether or not it is selected, and whether or not the semiconductor chip is selected is determined in accordance with signals that the semiconductor chip receives.

In the configuration illustrated in FIG. 1 and described previously, no semiconductor chip receives a dual chip enable signal from outside of the chip itself, so no semiconductor chip needs to use a separate option pad to receive a dual chip enable signal. Thus, it is possible to select a semiconductor chip in the dual chip package (i.e., in semiconductor chip package 1) using only two option pads.

First and second semiconductors CHIP1 and CHIP2 will be described in more detail subsequently with reference to FIG. 3.

Figure 2:
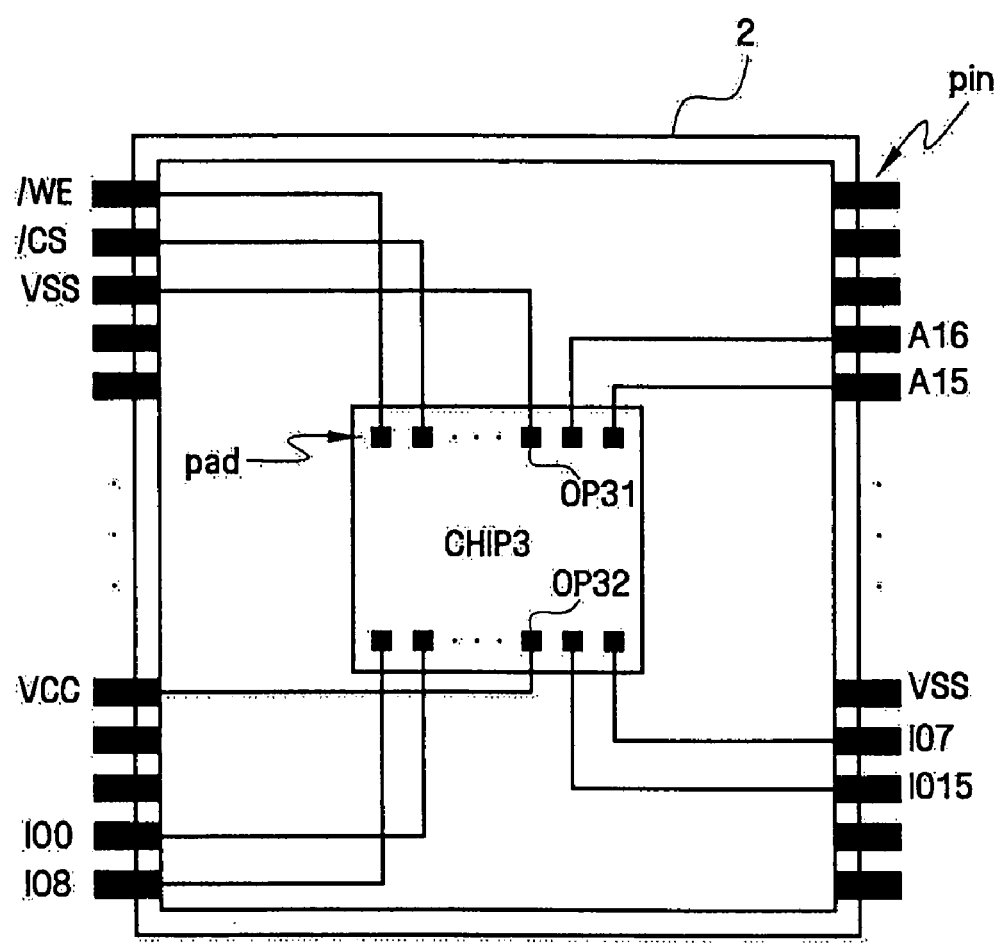
FIG. 2 is a layout diagram illustrating a semiconductor chip package in accordance with another embodiment of the invention.

FIG. 2 is a layout diagram illustrating a semiconductor chip package in accordance with another embodiment of the invention.

Referring to FIG. 2, a semiconductor chip package 2 in accordance with another embodiment of the invention comprises a semiconductor chip CHIP3 that is substantially the same as first and second semiconductor chips CHIP1 and CHIP2 of the embodiment illustrated in FIG. 1. Thus, semiconductor chip CHIP3 enters a dual chip mode in response to a dual chip enable signal generated inside of semiconductor chip CHIP3 and without needing to receive a separate dual chip enable signal from outside of semiconductor chip CHIP3. That is, even when semiconductor chip CHIP3 is used in a single chip package, semiconductor chip CHIP3 can enter the dual chip mode. However, semiconductor chip CHIP3 disposed in a single chip package must not be unselected in response to the signals received through first and second option pads OP31 and OP32 of semiconductor chip CHIP3. Therefore, so that semiconductor chip CHIP3 is always selected, the signal provided to first option pad OP31 must be fixed at a ground voltage and the signal provided to second option pad OP32 must be fixed at a power voltage. So, for example, in the embodiment illustrated in FIG. 2, first option pad OP31 is bonded to a package pin that receives ground voltage VSS, and second option pad OP32 is bonded to a package pin that receives power voltage VCC.

Semiconductor chip CHIP3 will be described in more detail subsequently with reference to FIG. 3.

Figure 3:
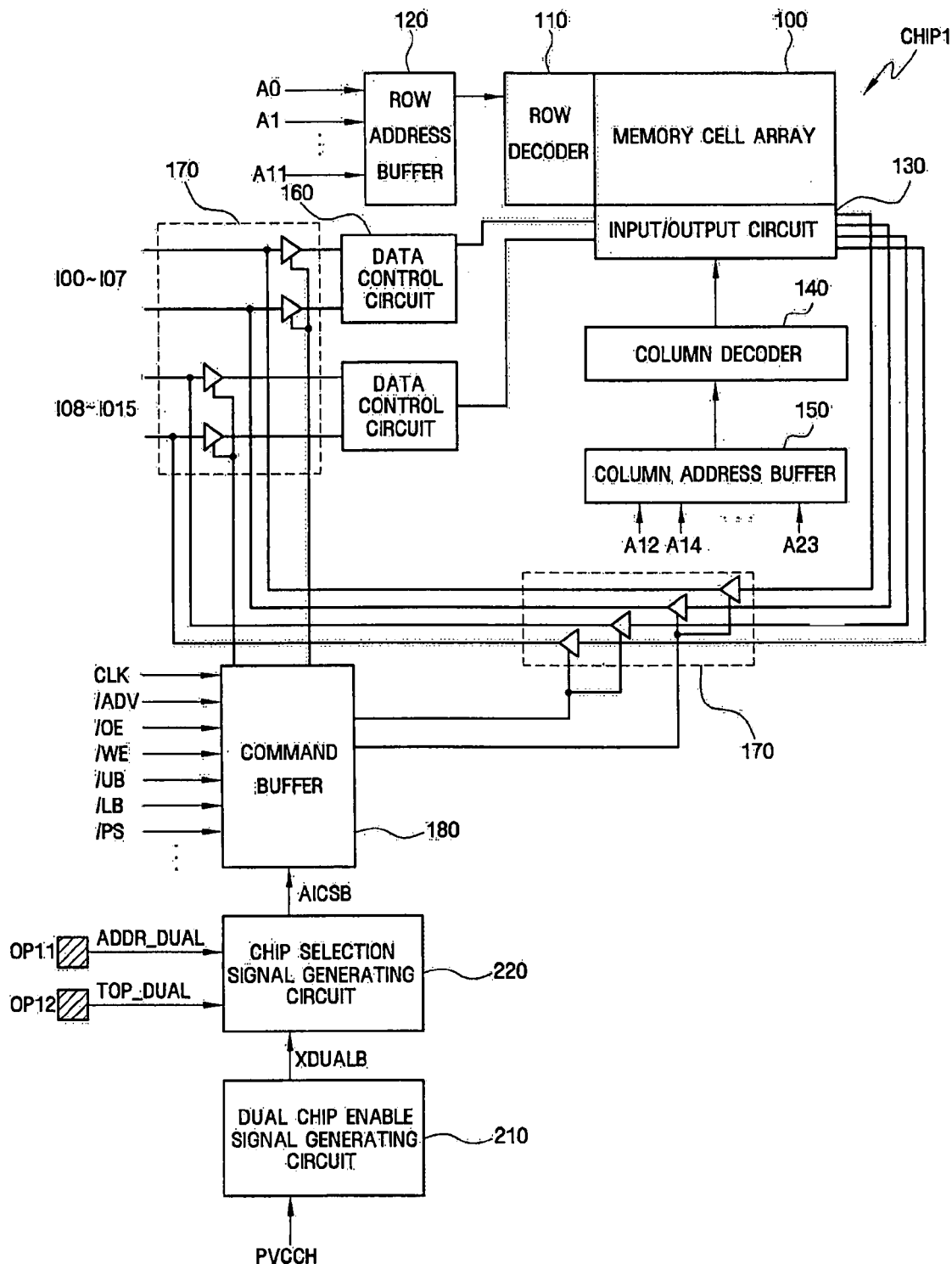
FIG. 3 is a block diagram illustrating a semiconductor chip in accordance with an embodiment of the invention.

FIG. 3 is a block diagram illustrating a semiconductor chip in accordance with an embodiment of the invention. Though the block diagram of FIG. 3 illustrates a Pseudo Static Random Access Memory (PSRAM) device, embodiments of the invention are not limited to PSRAM devices. Also, even though first semiconductor chip CHIP1 of FIG. 1 is shown and described with reference to FIG. 3, second semiconductor chip CHIP2 and semiconductor chip CHIP3 are substantially the same, so the description and illustration of first semiconductor chip CHIP1 also applies to second semiconductor chip CHIP2 and semiconductor chip CHIP3.

Referring to FIG. 3, semiconductor chip CHIP1 in accordance with an embodiment of the invention comprises a memory cell array 100, a control circuit, a dual chip enable signal generating circuit 210, and a chip selection signal generating circuit 220. Memory cell array 100 comprises a plurality of memory cells that are arranged in a matrix and are adapted to store data. Each of the memory cells comprises a transistor and a capacitor like the cells of a Dynamic Random Access Memory (DRAM) device.

The control circuit is configured (i.e., formed) in accordance with an SRAM interface and controls an operation mode of memory cell array 100 in accordance with the plurality of signals received from outside of first semiconductor chip CHIP1. That is, the control circuit controls a write mode, a read mode, and a refresh mode of first semiconductor chip CHIP1. In the embodiment of first semiconductor chip CHIP1 of FIG. 3, for example, the control circuit comprises a row decoder 110, a row address buffer 120, an input/output circuit 130, a column decoder 140, a column address buffer 150, a data control circuit 160, a data input/output buffer 170, and a command buffer 180, or similar elements.

Row address buffer 120 receives row address signals A0 to A11. Row decoder 110 decodes row address signals A0 to A11 in order to select a predetermined row of memory cell array 100. Column address buffer 150 receives column address signals A12 to A23, and column decoder 140 decodes column address signals A12 to A23 in order to operate input/output circuit 130 relative to a predetermined column of memory cell array 100. Data signals 00 to 107, and 108 to 1015 are input and output through data input/output buffer 170.

Command buffer 180 controls row decoder 110, row address buffer 120, input/output circuit 130, column decoder 140, column address buffer 150, data control circuit 160, and data input/output buffer 170 in accordance with a plurality of command signals received from outside of first semiconductor chip CHIP1. The plurality of command signals comprises the signals CLK, /ADV, /OE, /WE, /UB, /LB, /PS, etc. Even though, for convenience in the drawing, FIG. 3 only shows that command buffer 180 controls data input/output buffer 170, command buffer 180 of first semiconductor chip CHIP1 is not limited to controlling only data input/output buffer 170. As used herein, CLK refers to a clock outside of first semiconductor chip CHIP1, /ADV refers to an address valid signal, /OE refers to an output enable signal, /WE refers to a write enable signal, /UB refers to a upper byte signal, /LB refers to a lower byte signal, and /PS refers to a mode register set signal.

Dual chip enable signal generating circuit 210 generates a dual chip enable signal XDUALB in accordance with a power up signal PVCCH. Power up signal PVCCH is set to a predetermined logic level when an external power voltage provided to first semiconductor chip CHIP1 reaches a predetermined voltage level. That is, in accordance with the embodiment of the invention illustrated in FIG. 3, dual chip enable signal XDUALB is set to a default logic level when semiconductor chip CHIP1 is in a power up mode. First semiconductor chip CHIP1 is in the "power up mode" when the external power voltage provided to first semiconductor chip CHIP1 reaches or has reached a predetermined voltage level. Thus, when the external power voltage provided to first semiconductor chip CHIP1 reaches a predetermined voltage level (i.e., when first semiconductor chip CHIP1 is in a power up mode), power up signal PVCCH is set to a predetermined logic level, and, in response, dual chip enable signal generating circuit 210 generates dual chip enable signal XDUALB.

Figure 4:
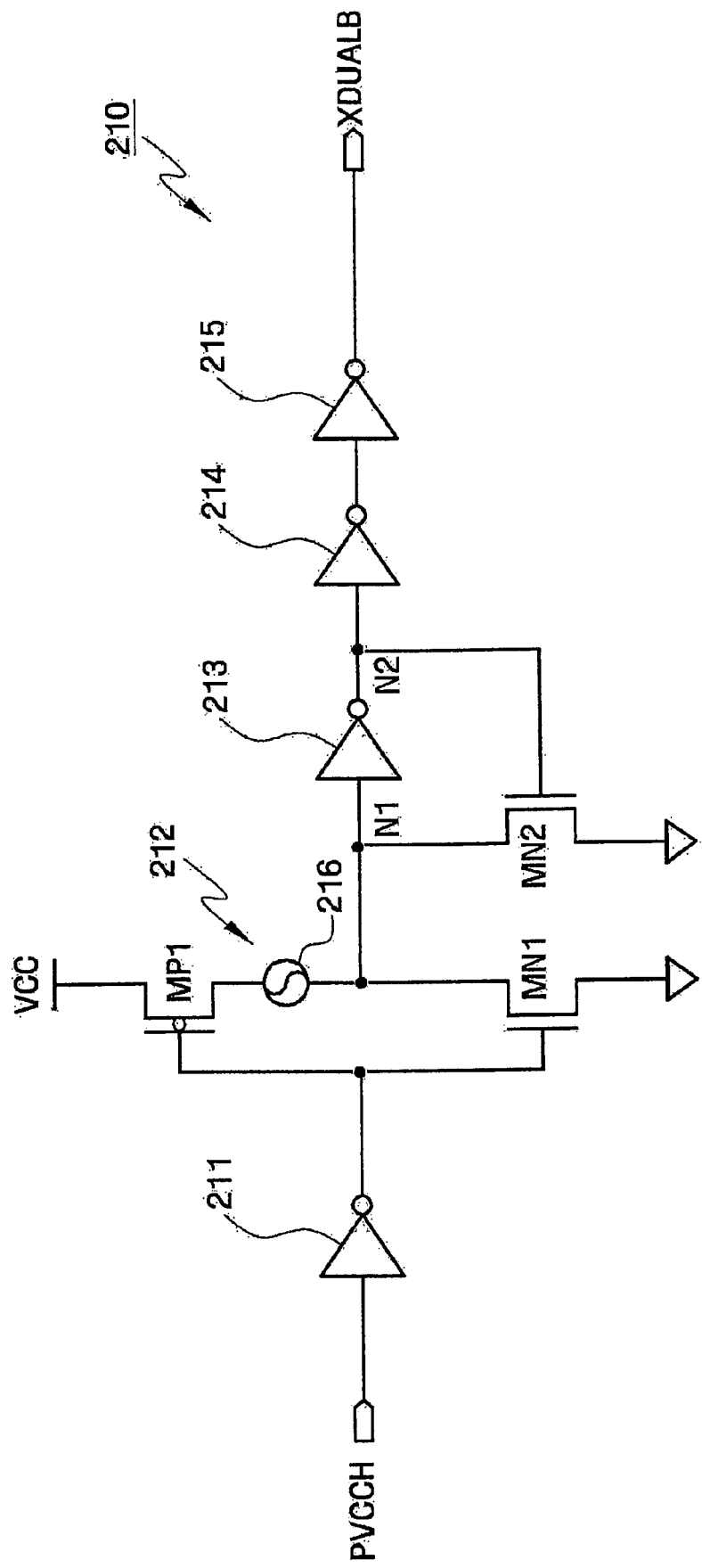
FIG. 4 is an circuit diagram illustrating the dual chip enable signal generating circuit of FIG. 3 in accordance with an embodiment of the invention.

An exemplary circuit implementing dual chip enable signal generating circuit 210 will now be described with reference to FIG. 4. Dual chip enable signal generating circuit 210 comprises a plurality of inverters connected in series. In particular, dual chip enable signal generating circuit 210 comprises inverters 211, 212, 213, 214, and 215, which are connected in series. As an exemplary operation, when the external power voltage provided to first semiconductor chip CHIP1 reaches the predetermined voltage level, and thus power up signal PVCCH is set to a logic high level, dual chip enable signal XDUALB is set to a logic low level.

In inverter 212, a fuse 216 is disposed between a first PMOS transistor MP1 and a first NMOS transistor MN1, thereby enabling dual chip enable signal generating circuit 210 to output a dual chip enable signal having a default logic level by selectively cutting fuse 216.

A second NMOS transistor MN2 is disposed between a first node N1 and a ground voltage node and is gated in accordance with a voltage level of a second node N2.

Referring to FIG. 3, chip selection signal generating circuit 220 is enabled in response to dual chip enable signal XDUALB and provides a chip selection signal AICSB to command buffer 180 in accordance with a chip selection address signal ADDR_DUAL and a voltage signal TOP_DUAL received from first and second option pads OP11 and OP12.

An exemplary circuit implementing chip selection signal generation circuit 220 will be described with reference to FIG. 5. Chip selection signal generating circuit 220 comprises an OR gate 222, an inverter 224, a NAND gate 226, and an exclusive OR gate 228. OR gate 222 performs an "OR" operation on dual chip enable signal XDUALB and chip selection address signal ADDR_DUAL, NAND gate 226 performs a "NAND" operation on an inverted version of dual chip enable signal XDUALB and voltage signal TOP_DUAL, and exclusive OR gate 228 performs an "exclusive OR" operation on the respective outputs of OR gate 222 and NAND gate 226.

Figure 5:
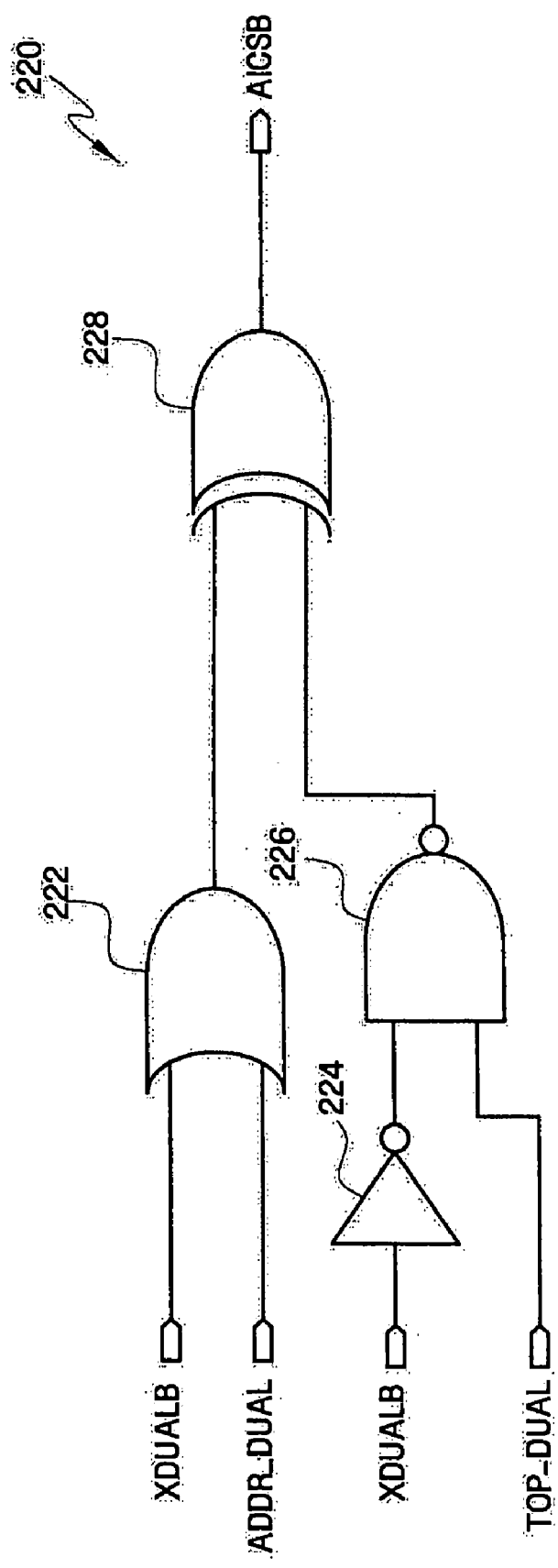
FIG. 5 is an circuit diagram illustrating the chip selection signal generating circuit of FIG. 3 in accordance with an embodiment of the invention; and, FIG. 6 is a block diagram illustrating a portion of a semiconductor chip in accordance with another embodiment of the invention.

Referring to FIGS. 1, 2, and 5, Table 1 shows the logic level of chip selection signal AICSB in accordance with the logic levels of dual chip enable signal XDUALB, chip selection address signal ADDR_DUAL, and voltage signal TOP_DUAL. The control circuit is enabled when chip selection signal AICSB has a logic low level, and the control circuit is disabled when chip selection signal AICSB has a logic high level.

TABLE 1

| | | XDUALB | ADDR_DUAL | TOP_DUAL | AICSB |
|---|---|---|---|---|---|
| Dual Chip Package | CHIP1 | L | L | H | L (selected) |
| | | L | H | H | H (non-selected) |
| | CHIP2 | L | L | L | H (non-selected) |
| | | L | H | L | L (selected) |
| Single Chip Package | CHIP3 | L | L | H | L (selected) |

Dual chip enable signal XDUALB is set to a default logic level, which is a logic low level, when first semiconductor chip CHIP1 is in a power up mode. So, when first semiconductor chip CHIP1 is in a power up mode, dual chip enable signal XDUALB has a logic low level regardless whether first semiconductor chip CHIP1 is used in a dual chip package or a single chip package.

Referring to FIGS. 1 and 3 and Table 1, in semiconductor chip package 1, which is a dual chip package, one of first and second semiconductor chips CHIP1 and CHIP2 is selected in accordance with chip selection address signal ADDR_DUAL and first and second voltage signals TOP_DUAL. Chip selection address signal ADDR_DUAL and first voltage signal TOP_DUAL are received by first semiconductor chip CHIP1 through first and second option pads OP11 and OP12, respectively, and chip selection address signal ADDR_DUAL and second voltage signal TOP_DUAL are received by second semiconductor chip CHIP2 through first and second option pads OP21 and OP22, respectively. The respective voltage levels of first and second voltage signals TOP_DUAL are not necessarily the same.

Specifically, first option pads OP11 and OP21 of first and second semiconductor chips CHIP1 and CHIP2, respectively, are each connected (i.e., bonded) to a package pin that receives chip selection address signal ADDR_DUAL (for example, MSB address). Further, since second option pad OP12 of first semiconductor chip CHIP1 is bonded to a package pin that receives power voltage VCC, voltage signal TOP_DUAL that is provided to first semiconductor chip CHIP1 has a logic high level. Furthermore, since second option pad OP22 of second semiconductor chip CHIP2 is bonded to a package pin that receives ground voltage VSS, voltage signal TOP_DUAL that is provided to second semiconductor chip CHIP2 has a logic low level.

When chip selection address signal ADDR_DUAL has a logic low level, first semiconductor chip CHIP1 is selected. That is, chip selection signal AICSB of first semiconductor chip CHIP1 is set to a logic low level, which enables the control circuit of first semiconductor chip CHIP1, and chip selection signal AICSB of second semiconductor chip CHIP2 is set to a logic high level, which disables the control circuit of second semiconductor chip CHIP2.

When chip selection address signal ADDR_DUAL has a logic high level, second semiconductor chip CHIP2 is selected. That is, chip selection signal AICSB of first semiconductor chip CHIP1 is set to a logic high level, which disables the control circuit of first semiconductor chip CHIP1, and chip selection signal AICSB of second semiconductor chip CHIP2 is set to a logic low level, which enables the control circuit of second semiconductor chip CHIP2.

Referring to FIGS. 2 and 3 and Table 1, in semiconductor chip package 2, which is a single chip package, the respective logic levels of the signals received through first and second option pads OP31 and OP32 are constant, so semiconductor chip CHIP3 is always selected.

Specifically, since first option pad OP31 of semiconductor chip CHIP3 is bonded to a package pin that receives ground voltage VSS, chip selection address signal ADDR_DUAL always has a logic low level. Further, since second option pad OP32 is bonded to a package pin that receives power voltage VCC, voltage signal TOP_DUAL is set to a logic high level. As shown in Table 1, semiconductor chip CHIP3 is always selected and always operates in the single chip package, that is, semiconductor chip package 2 of FIG. 2.

Thus, when any one of semiconductor chips CHIP1, CHIP2, and CHIP3 is used in either a dual chip package or a single chip package and the dual chip enable signal XDUALB is set to a default logic level, causing the semiconductor chip to enter a dual chip mode, the dual chip package and the single chip package will operate normally. Thus, even when using only two option pads on each semiconductor chip in the package, a dual chip package and a single chip package will each operate normally. Therefore, it is possible to increase the number of channels available for testing semiconductor chips (i.e., it is possible to use a sufficient number of channels for testing) and thereby improve the test environment.

Figure 6:
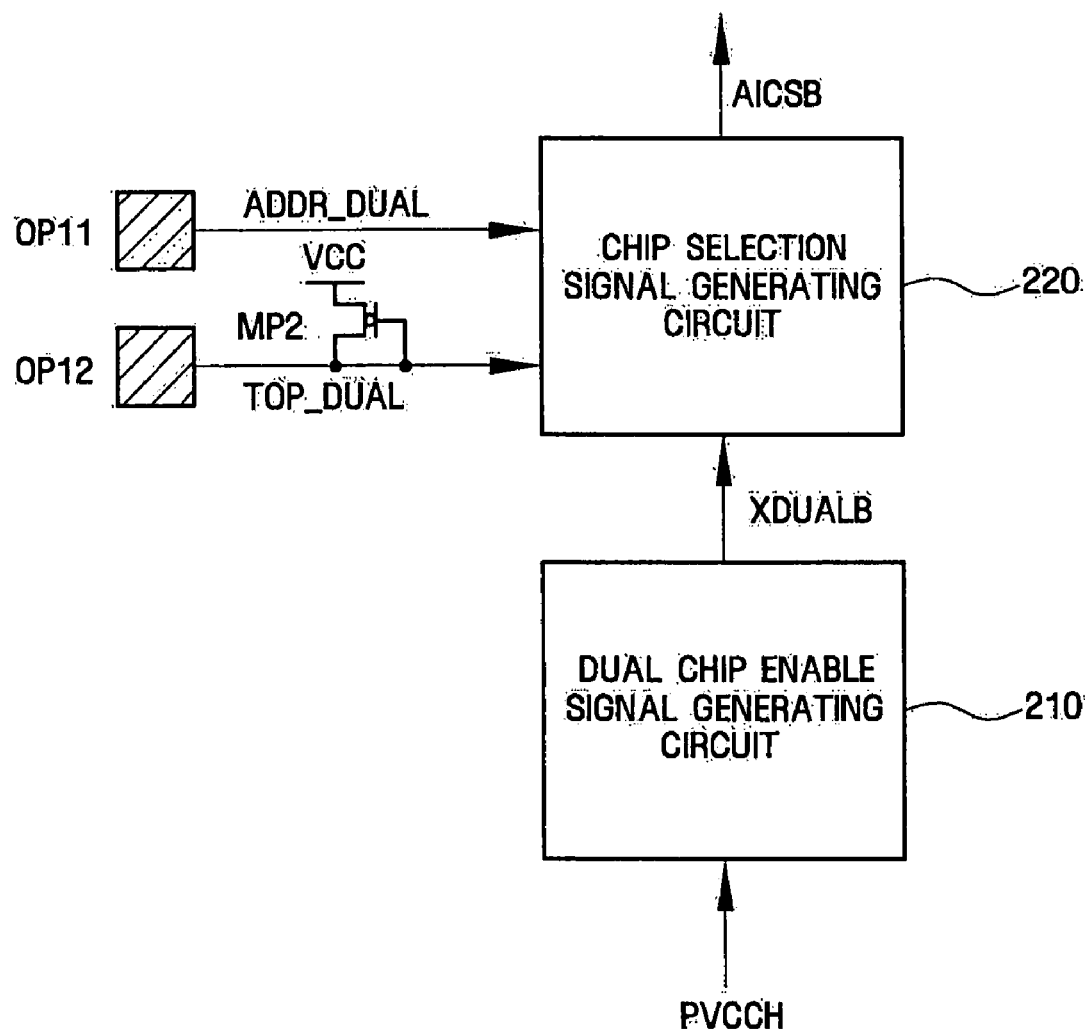

FIG. 6 is a block diagram illustrating a portion of a semiconductor chip in accordance with another embodiment of the invention. In FIGS. 3 and 6, like reference symbols refer to like elements, and elements previously described with reference to FIG. 3 will not be described again with reference to FIG. 6.

Referring to FIG. 6, in addition to the features shown in FIG. 3 and described with reference to FIG. 3, a semiconductor chip in accordance with another embodiment of the invention further comprises a pull-up element MP2 that is electrically connected between second option pad OP12, through which voltage signal TOP_DUAL is provided to chip selection signal generating circuit 220, and power voltage node VCC. In the embodiment illustrated in FIG. 6, pull-up element MP2 may have a relatively small driving capability.

When first semiconductor chip CHIP1 of semiconductor chip package 1 shown in FIG. 1 comprises pull-up element MP2, second option pad OP12 of first semiconductor chip CHIP1 does not need to be bonded to a package pin. Therefore, voltage signal TOP_DUAL that is provided to chip selection signal generating circuit 220 of first semiconductor chip CHIP1 is set to a logic high level by pull-up element MP2. However, second option pad OP22 of second semiconductor chip CHIP2 is bonded to a package pin that receives ground voltage VSS. Since second option pad OP22 of second semiconductor chip CHIP2 is bonded to a package pin that receives ground voltage VSS and the driving capability of pull-up element MP2 is relatively small, voltage signal TOP_DUAL that is provided to chip selection signal generating circuit 220 of second semiconductor chip CHIP2 through second option pad OP22 of second semiconductor chip CHIP2 is set to a logic low level.

In semiconductor chip package 2 shown in FIG. 2, second option pad OP32 does not need to be bonded to a package pin because voltage signal TOP_DUAL that is provided to second option pad OP32 is set to a logic high level by pull-up element MP2.

In accordance with embodiments of the invention, none of the semiconductor chips needs a separate option pad for receiving a dual chip enable signal, so, in accordance with embodiments of the invention, it is possible use fewer option pads of each semiconductor chip to operate in a dual chip mode and it is possible to select an appropriate semiconductor chip in a dual chip package using only two option pads of each semiconductor chip disposed in the dual chip package. Therefore, it is possible to increase the number of channels available for testing the semiconductor chips (i.e., it is possible to use a sufficient number of channels for testing) and thereby improve the test environment.

Although embodiments of the invention have been described herein, various modifications may be made to the embodiments described herein without departing from the scope of the invention as defined by the accompanying claims.

What is claimed is:

1. A semiconductor chip comprising:
   a memory cell array adapted to store data;
   a control circuit adapted to control an operation mode of the memory cell array in accordance with a plurality of signals received from outside of the semiconductor chip; and,
   a chip selection signal generating circuit electrically connected to first and second option pads,
   wherein:
      the chip selection signal generating circuit is enabled in accordance with a dual chip enable signal;
      the dual chip enable signal is set to a default logic level when the semiconductor chip is in a power up mode;
      the control circuit is enabled and disabled in accordance with the chip selection signal received from the chip selection signal generating circuit;
      the chip selection signal generating circuit is adapted to generate a chip selection signal in accordance with a first voltage signal received through the first option pad and a second voltage signal received through the second option pad, or in accordance with a chip selection address signal received through the first option pad and a third voltage signal received through the second option pad;
      the chip selection signal generating circuit is also adapted to generate a chip selection signal having a first logic level when the first voltage signal is received through the first option pad and the second voltage signal is received through the second option pad;
      the chip selection signal generating circuit is also adapted to generate a chip selection signal having the first logic level or a second logic level in accordance with a logic level of the chip selection address signal and a logic level of the third voltage signal when the chip selection address signal is received through the first option pad and the third address signal is received through the second option pad; and,
      the control circuit is enabled when the control circuit receives the chip selection signal having the first logic level.

2. The semiconductor chip of claim 1, wherein the dual chip enable signal is generated in accordance with a power up signal, and the power up signal is set to a predetermined logic level when an external power voltage provided to the semiconductor chip reaches a predetermined voltage level.

3. The semiconductor chip of claim 1, wherein the chip selection address signal is a Most Significant Bit (MSB) address signal.

4. The semiconductor chip of claim 1, wherein:
   the first option pad is bonded to a first package pin adapted to receive a ground voltage; or,
   the first option pad is bonded to a second package pin adapted to receive a chip selection address signal.

5. The semiconductor chip of claim 1, wherein:
   the second option pad is bonded to a first package pin adapted to receive a power voltage; or,
   the second option pad is bonded to a second package pin adapted to receive a ground voltage.

6. The semiconductor chip of claim 1, wherein:
   the second option pad is bonded to a package pin adapted to receive a ground voltage; or,
   the second option pad is not bonded to any package pin.

7. The semiconductor chip of claim 1, wherein the semiconductor chips are Pseudo Static Random Access Memory (PSRAM) devices.

8. A semiconductor chip package comprising:
   first and second semiconductor chips each having the same address coding scheme and each comprising first and second option pads,
   wherein each of the first and second semiconductor chips comprises:
      a memory cell array adapted to store data;
      a control circuit adapted to control an operation mode of the memory cell array in accordance with a plurality of signals received from outside of the semiconductor chip; and,
      a chip selection signal generating circuit adapted to generate a chip selection signal in accordance with a chip selection address signal received from outside of the semiconductor chip and through the first option pad, and a voltage signal received through the second option pad,
   wherein:
      the chip selection signal generating circuit is enabled in accordance with a dual chip enable signal generated inside of the semiconductor chip;
      the chip selection signal generating circuit is adapted to provide the chip selection signal to the control circuit; and,
      the control circuit is enabled and disabled in accordance with the chip selection signal.

9. The semiconductor chip package of claim 8, wherein the dual chip enable signal is set to a default logic level when the semiconductor chip is in a power up mode.

10. The semiconductor chip package of claim 9, wherein, for each of the first and second semiconductor chips, the dual chip enable signal is generated in accordance with a power up signal, and the power up signal is set to a predetermined logic level when an external power voltage provided to the semiconductor chip reaches a predetermined voltage level.

11. The semiconductor chip package of claim 8, wherein the chip selection address signal is a Most Significant Bit (MSB) address signal.

12. The semiconductor chip package of claim 8, wherein the voltage signal received by the first semiconductor chip is different than the voltage signal received by the second semiconductor chip.

13. The semiconductor chip package of claim 12, wherein the second option pad of the first semiconductor chip is bonded to a first package pin adapted to receive a power voltage and the second option pad of the second semiconductor chip is bonded to a second package pin adapted to receive a ground voltage.

14. The semiconductor chip package of claim 12, further comprising:
   a first pull-up element electrically connected between the second option pad of the first semiconductor chip and a power voltage; and,
   a second pull-up element electrically connected between the second option pad of the second semiconductor chip and the power voltage.

15. The semiconductor chip package of claim 14, wherein the second option pad of the first semiconductor chip is not bonded to any package pin and the second option pad of the second semiconductor chip is bonded to a package pin adapted to receive a ground voltage.

16. The semiconductor chip package of claim 8, wherein the semiconductor chips are Pseudo Static Random Access Memory (PSRAM) devices.

17. A semiconductor chip package comprising:
   a semiconductor chip adapted to operate in a dual chip mode comprising:
      first and second option pads;
      a memory chip array adapted to store data;
      a control circuit adapted to control an operation mode of the memory cell array in accordance with a plurality of signals received from outside of the semiconductor chip; and,
      a chip selection signal generating circuit electrically connected to the first and second option pads,
   wherein:
      the chip selection signal generating circuit is adapted to generate a chip selection signal having a first logic level in accordance with first and second voltage signals received through the first and second option pads, respectively, and is adapted to provide the chip selection signal to the control circuit;
      the control circuit is enabled by the chip selection signal having the first logic level;
      the chip selection signal generating circuit is enabled in accordance with a dual chip enable signal; and,
      the dual chip enable signal is set to a default logic level when the semiconductor chip is in a power up mode.

18. The semiconductor chip package of claim 17, wherein the dual chip enable signal is generated in accordance with a power up signal, and the power up signal is set to a predetermined logic level when an external power voltage provided to the semiconductor chip reaches a predetermined voltage level.

19. The semiconductor chip package of claim 17, wherein the chip selection address signal is a Most Significant Bit (MSB) address signal.

20. The semiconductor chip package of claim 17, wherein the first option pad is bonded to a package pin adapted to receive a ground voltage.

21. The semiconductor chip package of claim 17, wherein the second option pad is bonded to a package pin adapted to receive a power voltage.

22. The semiconductor chip package of claim 17, further comprising a pull-up element electrically connected between the second option pad and a power voltage.

23. The semiconductor chip package of claim 22, wherein the second option pad is not bonded to any package pin.

24. The semiconductor chip package of claim 17, wherein the semiconductor chip is a Pseudo Static Random Access Memory (PSRAM) device.

* * * * *